United States Patent [19]
Fiedler et al.

[11] Patent Number: 5,854,575
[45] Date of Patent: Dec. 29, 1998

[54] DUAL-LOOP PHASE-LOCKED LOOP

[75] Inventors: Alan S. Fiedler, Minneapolis; Daniel J. Baxter, St. Paul, both of Minn.

[73] Assignee: LSI Logic Corporation, Milpitas, Calif.

[21] Appl. No.: 969,100

[22] Filed: Nov. 13, 1997

[51] Int. Cl.$^6$ ........................................................ H03L 7/08
[52] U.S. Cl. .............................. 331/10; 331/17; 331/1 A; 331/108 C; 327/157
[58] Field of Search ................................ 331/108 C, 1 A, 331/17, 10, 108 D; 327/157

[56] References Cited

U.S. PATENT DOCUMENTS

| | | | |
|---|---|---|---|
| 4,857,866 | 8/1989 | Tateishi | 331/1 A |
| 5,144,156 | 9/1992 | Kawasaki | 307/262 |
| 5,539,344 | 7/1996 | Hatakenaka | 327/147 |
| 5,659,588 | 8/1997 | Fiedler | 375/376 |

*Primary Examiner*—Steven Mottola
*Assistant Examiner*—Arnold Kinkead

[57] ABSTRACT

An integrated circuit phase-locked loop includes a phase/frequency detector, a charge pump, and a voltage-controlled oscillator (VCO) which are coupled together in series. The VCO has first and second VCO control inputs, and has a VCO output which is coupled to the phase/frequency detector. An off-chip loop filter input is coupled between the charge pump and the first VCO control input for coupling to an off-chip loop filter. An on-chip loop filter is coupled between the first VCO control input and the second VCO control input. The VCO has a lower voltage-to-frequency gain from the first VCO control input to the VCO output than from the second VCO control input to the VCO output.

12 Claims, 8 Drawing Sheets

DUAL-LOOP PHASE-LOCKED LOOP

BACKGROUND OF THE INVENTION

The present invention relates to phase-locked loops (PLLs) and, in particular, to a dual-loop integrated PLL having an on-chip loop filter and an off-chip loop filter.

PLLs are used in integrated circuits, such as application specific integrated circuits (ASICs), for clock synchronization, recovery of serial data streams and frequency synthesis. A typical PLL includes a phase/frequency detector, a charge pump, a loop filter, a voltage-controlled oscillator (VCO) and a frequency divider. The VCO generates a clock signal with a phase and frequency that is a function of the voltage applied to the oscillator. The phase/frequency detector detects a phase and/or frequency difference between the VCO output and the input signal. The phase/frequency detector generates a control signal as a function of the difference and applies the control signal to the charge pump which increases or decreases the voltage across the loop filter. This voltage is applied to the VCO for controlling the oscillation frequency and phase of the clock signal.

In a PLL fabricated on an integrated circuit, it is often desirable to have the loop filter external to the integrated circuit. With an off-chip loop filter, filter component values can be easily changed to accommodate a specific application, and the filter cut-off frequency can be tightly controlled since the discrete resistor and capacitor which form the loop filter are economically available with values having 1–5 percent tolerances. Lower cut-off frequencies are also achievable with an off-chip loop filter, as opposed to an on-chip loop filter. Low-leakage, very low-cost ceramic capacitors are available with capacitances up to 100,000 pF, whereas the maximum economical on-chip capacitor is on the order of 10's of pF. For applications requiring a lower filter cut-off frequency, such as in high resolution frequency synthesis, an on-chip loop filter is difficult.

However, a significant problem results when the loop filter is brought off-chip. The loop filter output is coupled to an external pin on the integrated circuit which, in turn, is coupled to the frequency control input of the voltage-controlled oscillator. For a wide-band, low Q, ring-oscillator type VCO, the frequency control input of the VCO is always a high-gain input. For a 100 MHz PLL of this type, the VCO gain ($K_{VCO}$) is usually designed to be at least 100 MHz/V, and sometimes as high as 1,000 MHz/V. With an off-chip loop filter, the high-gain frequency control input is exposed to switching noise from the circuit board on which the integrated circuit is mounted and from switching noise adjacent to the external pin. This noise shows up in the PLL output as jitter in the time domain and as spurs in the frequency domain. A PLL having an off-chip loop filter and which is less susceptible to switching noise is desired.

SUMMARY OF THE INVENTION

The dual-loop phase-locked loop of the present invention includes a phase/frequency detector, a charge pump, and a voltage-controlled oscillator (VCO) which are coupled together in series on an integrated circuit. The VCO has first and second VCO control inputs, and has a VCO output which is coupled to the phase/frequency detector. An off-chip loop filter input is coupled between the charge pump and the first VCO control input for coupling to an off-chip loop filter. An on-chip loop filter is coupled between the first VCO control input and the second VCO control input. The VCO has a lower voltage-to-frequency gain from the first VCO control input to the VCO output than from the second VCO control input to the VCO output.

Another aspect of the present invention relates to a method of generating a feedback signal in a phase-locked loop (PLL). The method includes comparing a phase and frequency of a reference signal to a phase and frequency of the feedback signal; generating a charge pump control signal as a function of the comparison; pumping charge onto and off of a circuit node as a function of the charge pump control signal; generating first and second frequency control voltages based on the charge pumped onto and off of the circuit node; filtering the first frequency control voltage with an off-chip loop filter; filtering the second frequency control voltage with an on-chip loop filter; controlling the phase and frequency of the feedback signal as a function of the filtered first frequency control voltage; and controlling a center frequency of the feedback signal as a function of the filtered second frequency control voltage.

DETAILED DESCRIPTION OF THE PREFERRED EMBODIMENTS

Figure 1:
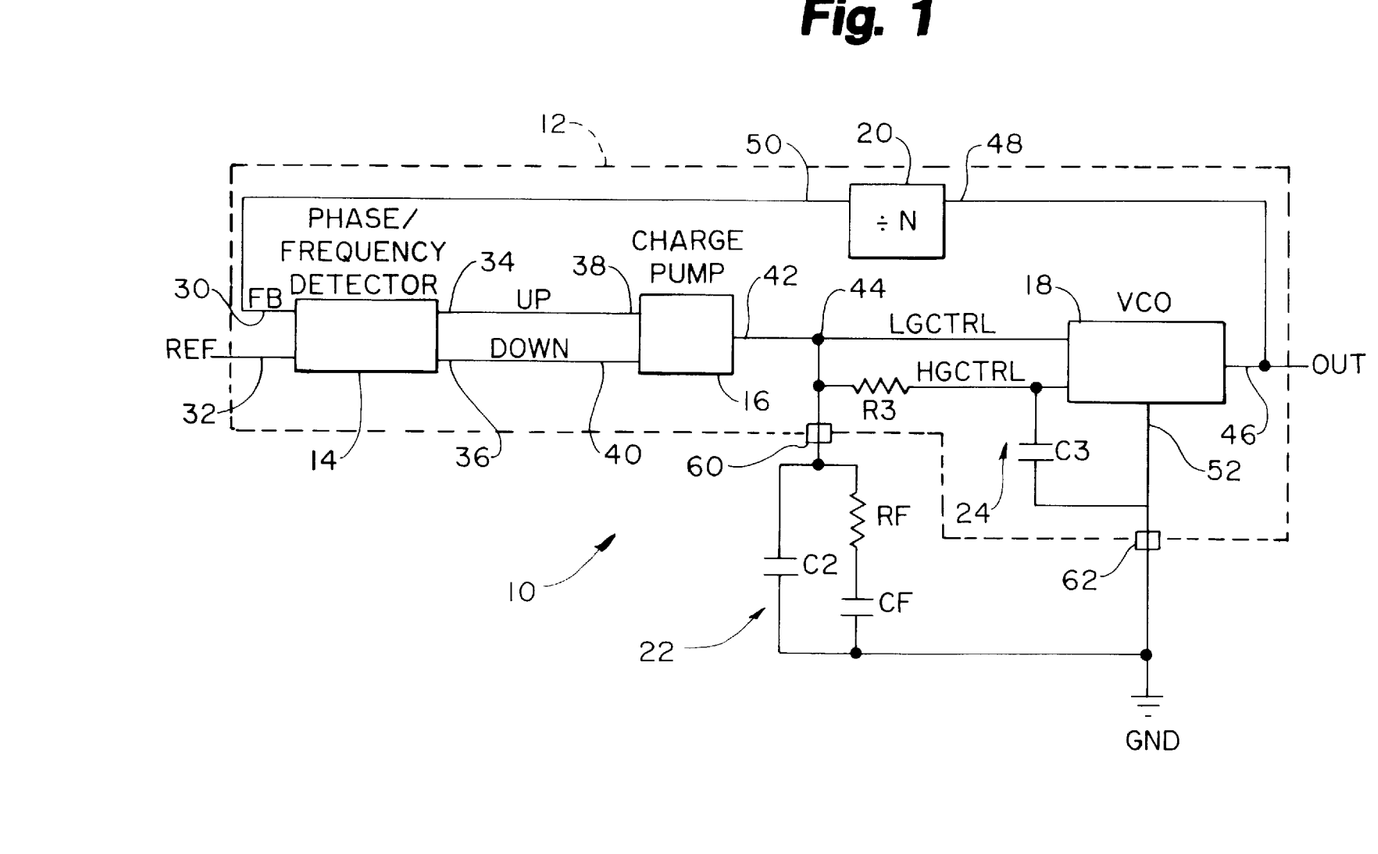
FIG. 1 is a schematic diagram of a dual-loop PLL according to one embodiment of the present invention.

FIG. 1 is a schematic diagram of a dual-loop PLL having an off-chip loop filter and an on-chip loop filter according to one embodiment of the present invention. PLL 10 is implemented on an integrated circuit 12 and includes phase/frequency detector 14, charge pump 16, voltage-controlled oscillator (VCO) 18, divide by N frequency divider 20, off-chip loop filter 22 and on-chip loop filter 24.

Phase/frequency detector 14 has detector inputs 30 and 32 and outputs 34 and 36. Outputs 34 and 36 are coupled to inputs 38 and 40 of charge pump 16. Charge pump 16 has an output 42 which is coupled to loop filter node 44. VCO 18 has a low gain control input LGCTRL, a high gain control input HGCTRL, a reference voltage input 52 and an output 46. Low gain control input LGCTRL is coupled to filter node 44. High gain control input HGCTRL is coupled to low gain control input LGCTRL through on-chip loop filter 24. Output 46 is coupled to input 48 of frequency divider 20. Frequency divider 20 has an output 50 which is coupled to input 30 of phase/frequency detector 14.

Integrated circuit 12 includes pins 60 and 62 for coupling to off-chip loop filter 22. Pin 60 is coupled to loop filter node 44, and pin 62 is coupled to VCO reference voltage input 52. Pin 62 is also coupled to ground terminal GND, which references VCO 18 to ground. In an alternative embodiment, VCO 18 and loop filter 22 are referenced to a voltage other than ground. Off-chip loop filter 22 is a second-order loop filter which includes filter resistor RF and filter capacitors CF and C2. Resistor RF is coupled between pin 60 and low pass filter output LGCTRLF. Capacitor CF is coupled between low pass filter output LGCTRLF and pin 62. Capacitor C2 is coupled between pins 60 and 62, in parallel with resistor RF and capacitor CF.

On-chip loop filter 24 is a first-order RC loop filter which includes filter resistor R3 and filter capacitor C3. Resistor R3 is coupled between low gain control input LGCTRL and high gain control input HGCTRL. Capacitor C3 is coupled between high gain control input HGCTRL and VCO reference voltage input 52.

During operation, VCO 18 generates a clock signal OUT on output 46 which has a phase and frequency that are a function of the voltage levels on low gain control input LGCTRL and high gain control input HGCTRL. Frequency divider 20 divides the frequency of clock signal OUT by a positive integer N, and applies the resulting signal as a feedback signal FB to input 30 of phase/frequency detector 14. Phase/frequency detector 14 detects a phase/frequency difference between a reference signal REF applied to input 32 and feedback signal FB applied to input 30. Phase/frequency detector 14 can include a variety of detectors, such as a three-state type detector which generates "UP" and "DOWN" signals on outputs 34 and 36 as a function of the phase/frequency difference between reference signal REF and feedback signal FB. The UP and DOWN signals are applied to charge pump 16 which causes the charge pump to increase, decrease or not change the voltage on loop filter node 44. The voltage on loop filter node 44 is directly applied to low gain control input LGCTRL and is applied to high gain control input HGCTRL through on-chip loop filter 24. VCO 18 then responsively increases, decreases or does not change the frequency of oscillation of clock signal OUT on output 46 as a function of the voltages on inputs LGCTRL and HGCTRL. PLL 10 therefore has a first control loop through off-chip loop filter 22 and low gain control input LGCTRL and a second control loop through on-chip loop filter 24 and high gain control input HGCTRL.

VCO 18 has a voltage-to-frequency gain $K_{VCO,LG}$ from low gain control input LGCTRL to output 46 and a voltage-to-frequency gain $K_{VCO,HG}$ from high gain control input HGCTRL to output 46. The gains $K_{VCO,LG}$ and $K_{VCO,HG}$ are given by $$K_{VCO,LG} = \frac{\Delta f_{OUT}}{\Delta V_{LGCTRL}} \qquad \text{Eq. 1}$$

$$K_{VCO,HG} = \frac{\Delta f_{OUT}}{\Delta V_{HGCTRL}} \qquad \text{Eq. 2}$$

Where, $\Delta f_{OUT}$ is the change in frequency of clock signal OUT, $\Delta V_{LGCTRL}$ is the change in voltage on low gain control input LGCTRL and $V_{HGCTRL}$ is the change in voltage on high gain control input HGCTRL. The overall transfer function of VCO 18 is $$f_{OUT} = K_{VCO,LG} V_{LGCTRL} + K_{VCO,HG} V_{HGCTRL} \qquad \text{Eq. 3}$$

where $K_{VCO,LG} \ll K_{VCO,HG}$.

The first control loop through low gain control input LGCTRL has a relatively low gain. This provides for low jitter in the presence of spurious coupling of undesirable signals onto off-chip loop filter 22 and filter node 44. The second control loop through high gain control input HGCTRL has a relatively high gain. This gives PLL 10 a wide frequency lock range. Because of the low cut-off frequency of on-chip loop filter 24, noise coupling onto LGCTRL is attenuated before reaching HGCTRL, which minimizes its impact on the phase and frequency of the VCO. The first and second loops work together to lock the VCO's phase and frequency to the phase and frequency of reference signal REF. The second control loop path can be thought of as a low-frequency loop which adjusts the VCO center, or average, frequency to the target frequency. When the second loop has settled to its final value, the first loop can then closely track the phase and frequency of reference signal REF at the higher loop bandwidth.

Stability of PLL 10 is guaranteed if the bandwidth of the second control loop is made sufficiently low. The first control loop is preferably designed for high bandwidth while still giving an overdamped, or near critically-damped, closed-loop response. As long as $R_3 \gg R_F$ and $R_3 C_3 \gg R_F C_F$, the key open loop parameters of phase margin and gain margin of PLL 10 are not compromised by the addition of $R_3$, $C_3$ and the high gain VCO control input HGCTRL to the PLL. In other words, when the feedback loop of PLL 10 is closed, the loop is stable and its damping factor is unchanged from the case of a "base" PLL with only the low gain feedback loop through low gain control input LGCTRL.

In an alternative embodiment, resistor R3 is implemented using a transimpedance amplifier, rather than a passive resistor. Also, one or both of the VCO control inputs can be differential, rather than signal-ended as shown in FIG. 1.

Figure 2:
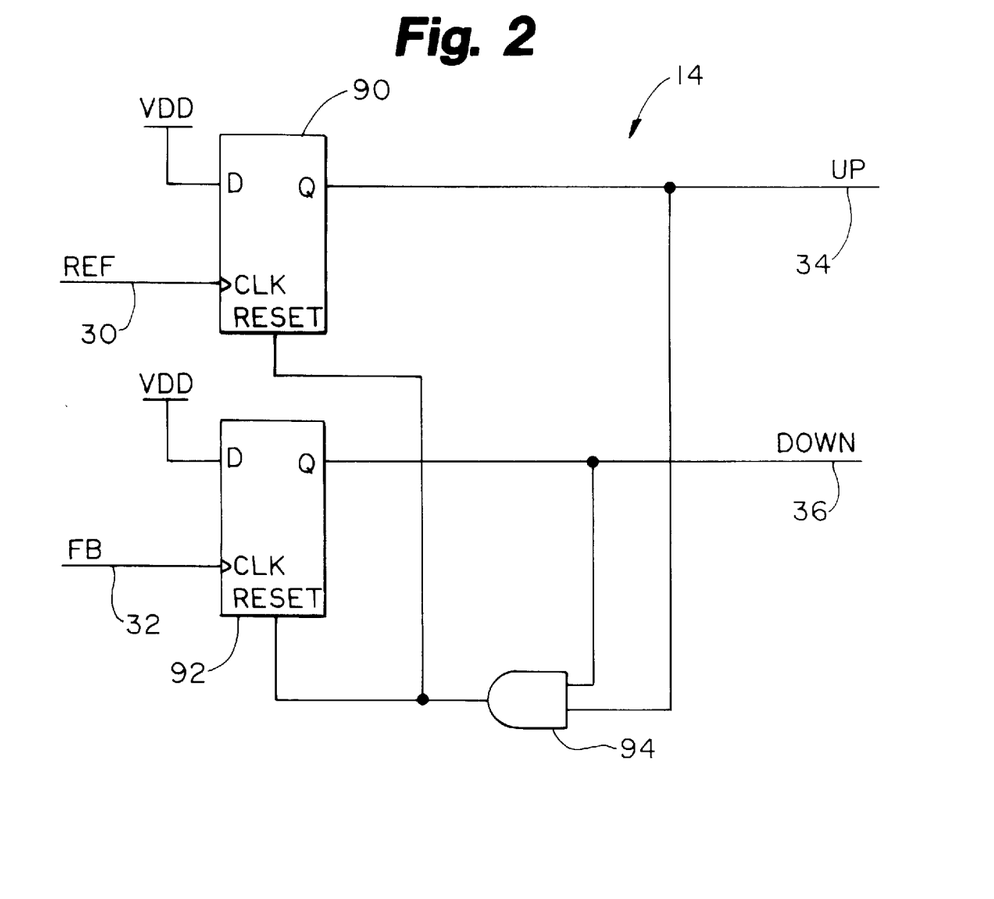
FIG. 2 is a schematic diagram of a phase/frequency detector according to one embodiment of the present invention.

FIG. 2 is a schematic diagram of phase/frequency detector 14 according to one embodiment of the present invention. Phase/frequency detector 14 includes D-type flip-flops 90 and 92 and AND gate 94. Flip-flop 90 has a data input coupled to voltage supply terminal VDD, a clock input coupled to detector input 30 for receiving reference signal REF, a reset input coupled to the output of AND gate 94 and a data output coupled to detector output 34 for generating the UP phase control signal. Flip-flop 92 has a data input coupled to voltage supply terminal VDD, a clock input coupled to detector input 32 for receiving feedback signal FB, a reset input coupled to the output of AND gate 94 and a data output coupled to detector output 36 for generating the DOWN phase control signal.

Figure 3:
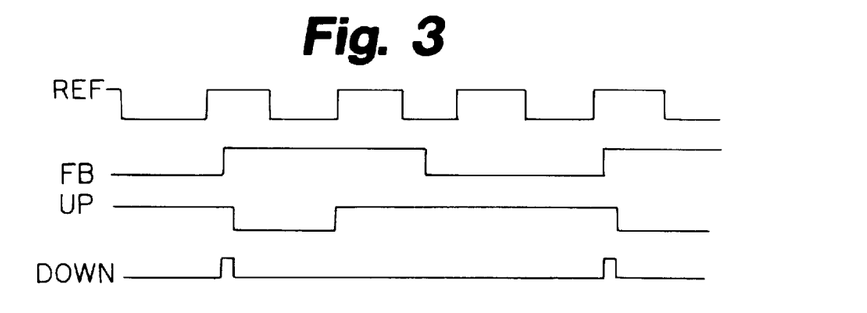
FIG. 3 is a waveform diagram illustrating the signals on the inputs and outputs of the phase/frequency detector shown in FIG. 2.

FIG. 3 is a waveform diagram illustrating the signals on the inputs and outputs of phase/frequency detector 14 with VCO 18 running too slow. With VCO 18 running too slow, the frequency of feedback signal FB is less than the frequency of reference signal REF. This causes flip-flop 64 to be clocked before flip-flop 66. Phase control signal UP transitions to a logic high level at the rising edge of REF and remains high until the next rising edge of FB, which lags REF. Phase control signal DOWN transitions briefly to a logic high level, until both UP and DOWN are reset by AND gate 94. The rising edge of UP always leads the rising edge of DOWN when VCO 18 runs too slow. When VCO 18 runs too fast (not shown in FIG. 3), feedback signal FB has a higher frequency the reference signal REF, and the rising edge of DOWN signal leads the rising edge of UP.

Figure 4:
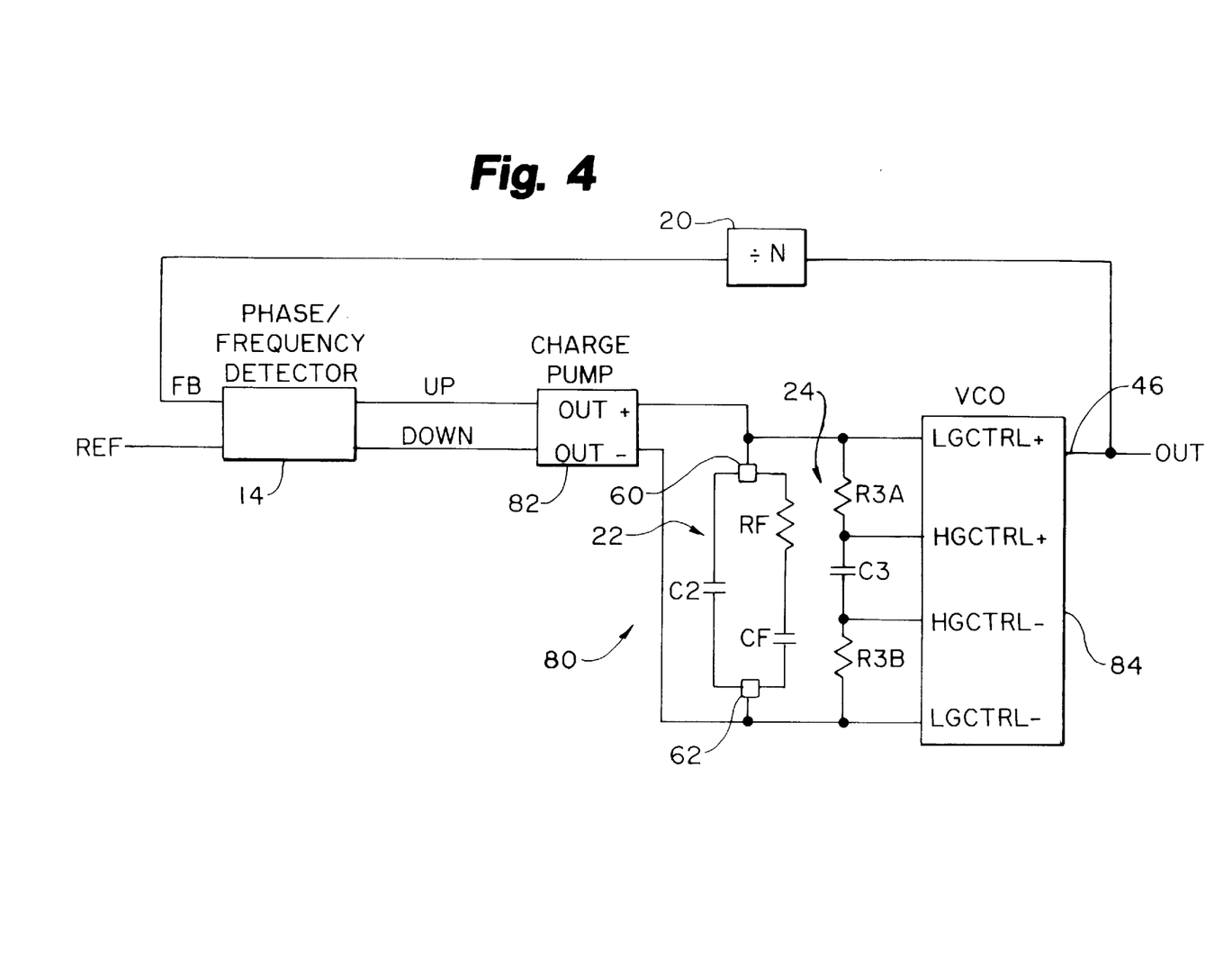
FIG. 4 is a schematic diagram of a dual-loop PLL having differential charge pump outputs and differential VCO control inputs.

FIG. 4 is a schematic diagram of a dual-loop PLL 80 having differential charge pump outputs and differential VCO control inputs. The same reference numerals are used in FIG. 4 as were used in FIG. 1 for the same or similar elements. Charge pump 82 has differential outputs OUT+ and OUT– which are coupled to differential VCO control inputs LGCTRL+ and LGCTRL–, respectively, of VCO 84. Off-chip loop filter 22 is coupled between pins 60 and 62, which are coupled to differential outputs OUT+ and OUT– of charge pump 82.

Differential high gain control inputs HGCTRL+ and HGCTRL– are coupled to differential low gain control inputs LGCTRL+ and LGCTRL–, respectively, through on-chip loop filter 24. On-chip loop filter 24 includes resistors R3A, R3B and capacitor C3. Resistor R3A is coupled between LGCTRL+ and HGCTRL+. Resistor R3B is coupled between LGCTRL– and HGCTRL–. Capacitor C3 is coupled between HGCTRL+ and HGCTRL–. The transfer function of VCO 84 is $$f_{OUT}=K_{VCO,LG}(V_{LGCTRL+}-V_{LGCTRL-})+K_{VCO,HG}(V_{HGCTRL+}-V_{HGCTRL-})$$

One drawback of the circuits shown in FIGS. 1 and 4 is that to guarantee PLL stability, the bandwidth of the second control loop must be made very low, and this results in a very long lock time as the second control loop slews and ultimately centers the VCO frequency to the target frequency. Adaptively reducing the time constant of the second control loop can shorten the PLL's lock time by as much as two or three orders of magnitude.

Figure 5:
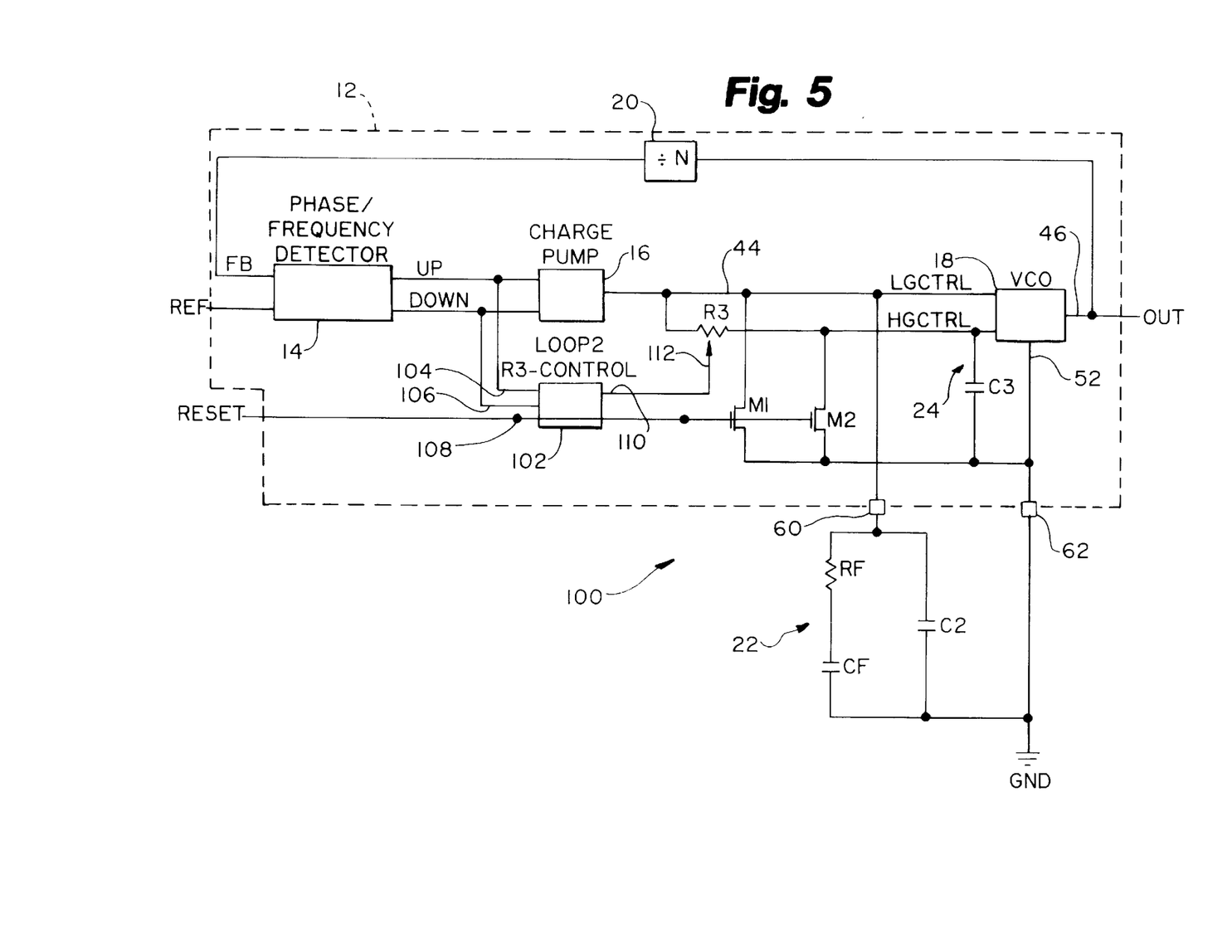
FIG. 5 is a schematic diagram of a dual-loop PLL having an adaptive time constant reduction on a second control loop according to an alternative embodiment of the present invention.

FIG. 5 is a schematic diagram of a dual-loop PLL having an adaptive time constant reduction on the second control loop according to another alternative embodiment of the present invention. The same reference numerals are used in FIG. 5 as were used in FIG. 1 for the same or similar elements. PLL 100 includes phase/frequency detector 14, charge pump 16, VCO 18, frequency divider 20, off-chip loop filter 22, on-chip loop filter 24, LOOP2 R3-CONTROL circuit 102 and N-channel transistors M1 and M2. LOOP2 R3-CONTROL circuit 102 includes oscillation detection inputs 104 and 106, reset input 108 and resistance control output 110. Oscillation detection inputs 104 and 106 are coupled to outputs 34 and 36, respectively, of phase/frequency detector 14. Reset input 108 receives a reset signal RESET. In the embodiment shown in FIG. 5, filter resistor R3 is replaced with a variable filter resistor circuit "R3" having a resistance control input 112 which is coupled to resistance control output 110.

Transistor M1 has a gate coupled to reset input 108, a source coupled to reference voltage input 52 of VCO 18 and a drain coupled to low gain control input LGCTRL. Transistor M2 has a gate coupled to reset input 108, a source coupled to VCO reference voltage input 52 and a drain coupled to high gain control input HGCTRL.

Figure 6:
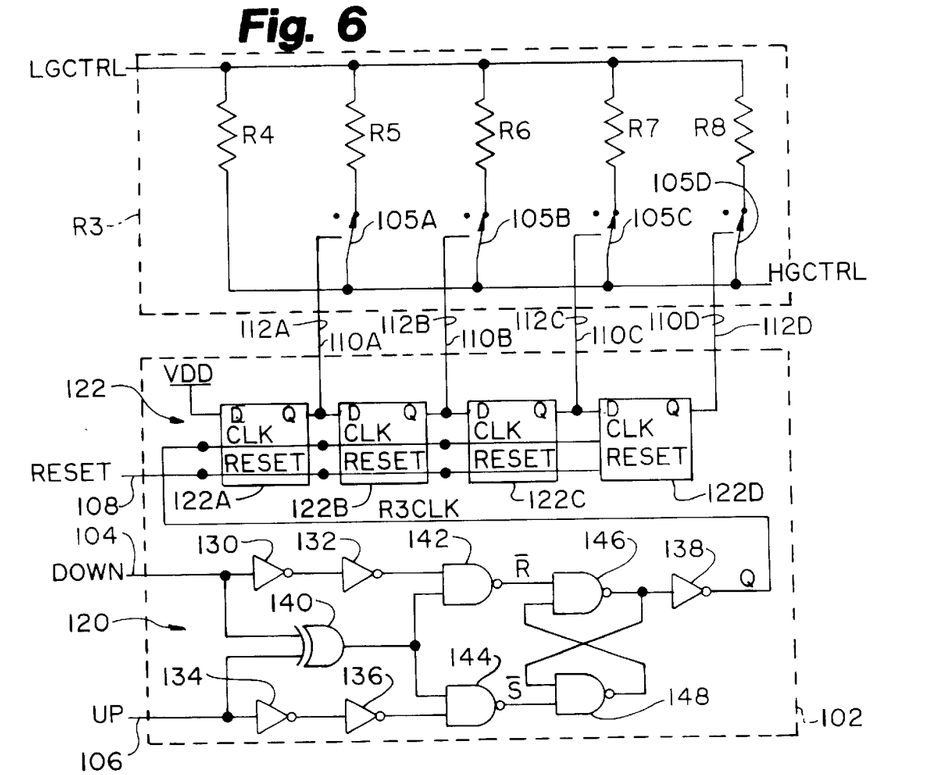
FIG. 6 is a schematic diagram of a control circuit for adjusting a filter resistance in the second control loop of the PLL shown in FIG. 5.

LOOP2 R3-CONTROL circuit 102 and filter resistor circuit R3 are shown in greater detail in FIG. 6. LOOP2 R3-CONTROL circuit 102 includes latch circuit 120 and shift register 122. Latch circuit 120 includes inverters 130, 132, 134, 136 and 138, XOR gate 140, and NAND gates 142, 144, 146 and 148. Inverters 130 and 132 are coupled in series between input 104 and one of the inputs of NAND gate 142. Inverters 134 and 136 are coupled in series between input 106 and one of the inputs of NAND gate 144. The inputs of XOR gate 140 are coupled to inputs 104 and 106, respectively. The output of XOR gate 140 is coupled to the other inputs of NAND gates 142 and 144. The output of NAND gate 142 is coupled to a reset input $\overline{R}$ of NAND gate 146, and the output of NAND gate 144 is coupled to a set input $\overline{S}$ of NAND gate 148. The output of NAND gate 146 is coupled to the other input of NAND gate 148 and to the input of inverter 138. The output of NAND gate 148 is coupled to the other input of NAND gate 146. The output of inverter 138 is coupled to circuit node R3CLK. NAND gates 146 and 148 and inverter 138 together form an RS latch having reset input $\overline{R}$, set input $\overline{S}$ and an output Q.

Shift register 122 is formed by D-type flip-flops 122A, 122B, 122C and 122D. Each flip-flop 122A–122D includes a clock input, a reset input, a data input and a data output. The clock input of each flip-flop 122A–122D is coupled to circuit node R3CLK. The reset input of each flip-flop 122A–122D is coupled to reset input 108. The data input of flip-flop 122A is coupled to a logic high level, at voltage supply terminal VDD. The data inputs of flip-flops 122B–122D are coupled to the data outputs of flip-flops 122A–122C, respectively. Also, the data outputs of flip-flops 122A–122D are coupled to resistance control outputs 110A–110D, respectively.

Outputs 110A–110D are coupled to inputs 112A–112D, respectively, of filter resistor circuit R3. Filter resistor circuit R3 includes resistors R4–R8. Resistor R4 is coupled between low gain control input LGCTRL and high gain control input HGCTRL. Resistors R5–R8 are selectively coupled in parallel with resistor R4 through switches 150A–150D, respectively, which are controlled by the resistance control signals received on inputs 112A–112D. In one embodiment, resistor R4 has a resistance of 10,000 R, resistor R5 has a resistance of R, resistor R6 has a resistance of 10 R, resistor R7 has a resistance 100 R and resistor R8 has a resistance of 1,000 R. This provides filter resistor circuit R3 with a resistance that can be selectively incremented by factors of about ten.

Operation begins with reset signal RESET being asserted high, which forces the resistance R3 to its minimum value by coupling resistors R5–R8 in parallel with resistor R4. This causes PLL 100 to become unstable. Also, RESET signal RESET turns on transistors M1 and M2 (shown in FIG. 5), which pull LGCTRL and HGCTRL to ground. Since LGCTRL and HGCTRL are at ground after reset, VCO 18 runs too slow.

After reset signal RESET is deasserted, low gain control input LGCTRL and high gain control input HGCTRL oscillate above and below their final, stable values. This instability is detected by monitoring the UP and DOWN signals generated by phase/frequency detector 14 with LOOP2 R3-CONTROL circuit 102. As shown in FIG. 3, the rising edge of UP will always occur before the rising edge of DOWN when VCO 18 is too slow. With UP leading DOWN, the inputs of NAND gate 144 are both high, which generates a logic low state on the $\overline{S}$ input of NAND gate 148. This generates a logic high state on the output of NAND gate 148 and thus on the input of NAND gate 146. Since the $\overline{R}$ input of NAND gate 146 is also high, the output of NAND gate goes low and circuit node R3CLK goes high.

The low-to-high transition on R3CLK shifts the logic high state at the input of flip-flop 122A to the output of flip-flop 122A, which opens switch 150A and decouples resistor R5 from the parallel connection with resistor R4. Decoupling resistor R5 increases the resistance of filter resistor circuit R3 by a factor of about ten. R3CLK remains high until the DOWN signals lead the UP signals, causing the RS latch formed by NAND gates 146 and 148 and inverter 138 to reset.

With the UP signals leading the DOWN signals, charge pump 16 eventually increases the voltage on filter node 44 until VCO 18 runs too fast. With VCO 18 running to fast, the rising edge of DOWN will occur before the rising edge of UP, which resets R3CLK to a logic low state and causes charge pump to decrease the voltage on filter node 44 until VCO 18 runs too slow again. VCO 18 oscillates between running too slow (with UP leading DOWN) and running too fast (with DOWN leading UP). This instability results in the repeated toggling of R3CLK, and at each rising edge of R3CLK, the resistance of filter resistor circuit R3 is increased by a factor 10. This process continues until the loop is stable, as shown in the waveform diagrams of FIGS. 7A and 7B.

Figure 7A:
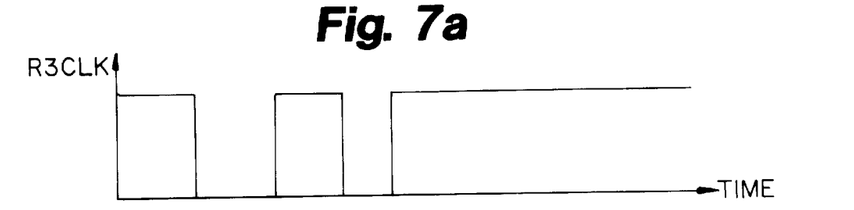
FIGS. 7A and 7B are waveform diagrams illustrating the logic state of a control node R3CLK and the frequency of a feedback signal FB relative to a reference signal REF over time.
Figure 7B:
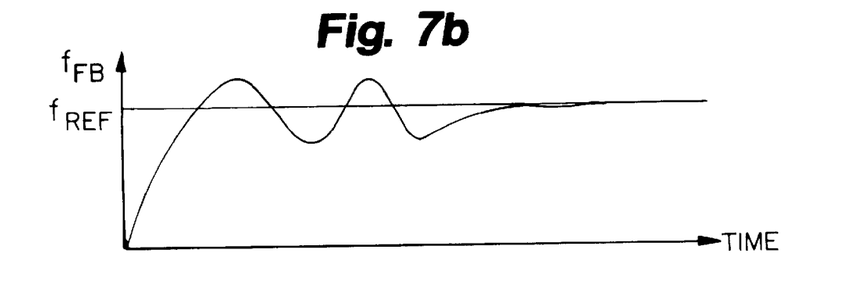

FIG. 7A is a waveform diagram illustrating the logic state of R3CLK over time. Each rising edge of R3CLK triggers a shift in shift register 122 and therefore an increase in the resistance of filter resistor circuit R3. FIG. 7B is a waveform diagram which illustrates the frequency of the feedback signal FB relative to the frequency of reference signal REF over time. The frequency of feedback signal FB oscillates about the frequency of reference signal REF until the loop is stable and is locked on the frequency of reference signal REF.

With the adaptive increase in the resistance of filter resistor circuit R3, the lock time for PLL 100 is reduced because the HGCTRL slew rate is fast (though PLL 100 is unstable) at the beginning of the lock sequence and is slowed only as the voltage on HGCTRL approaches its final value.

The circuit shown in FIG. 6 can be modified to include any number of switchable resistors in filter resistor circuit R3, and can be modified to switch on the rising edge of R3CLK, the falling edge of R3CLK or both the rising and falling edges of R3CLK. Also, the resistances of the resistors in filter resistor circuit R3 can be selected to suit a particular application.

Figure 8:
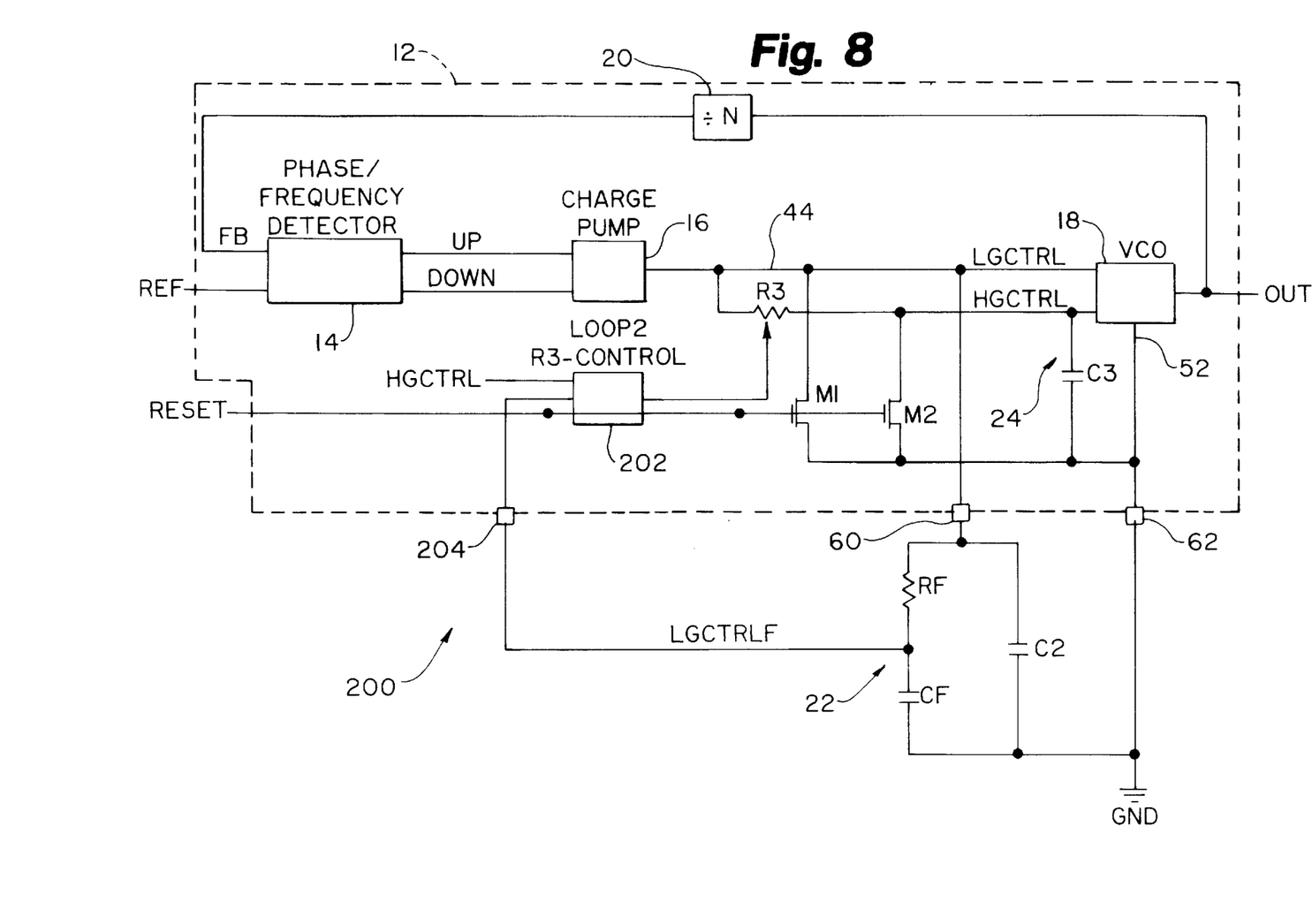
FIG. 8 is a schematic diagram of a dual-loop PLL according to another alternative embodiment of the present invention.

FIG. 8 is a schematic diagram of a dual-loop PLL according to another alternative embodiment of the present invention. The same reference numerals are used in FIG. 8 as were used in FIGS. 1 and 5 for the same or similar elements. LOOP2 R3-CONTROL circuit 102 is replaced with LOOP2 R3-CONTROL circuit 202. The oscillation detection inputs of LOOP2 R3-CONTROL circuit 202 are coupled to high gain control input HGCTRL and off-chip loop filter node LGCTRLF, through pin 204 of integrated circuit 12. LOOP2 R3-CONTROL circuit 202 tracks instability of PLL 200 by monitoring the voltage difference between off-chip loop filter node LGCTRLF and high gain control input HGCTRL. After reset, when PLL 200 is unstable, the voltage on LGCTRLF will tend to oscillate about the voltage on HGCTRL. This oscillation is detected by LOOP2 R3-CONTROL circuit 202, and the resistance of resistor circuit R3 is increased in an incremental fashion, as in the embodiment shown in FIG. 5.

Figure 9:
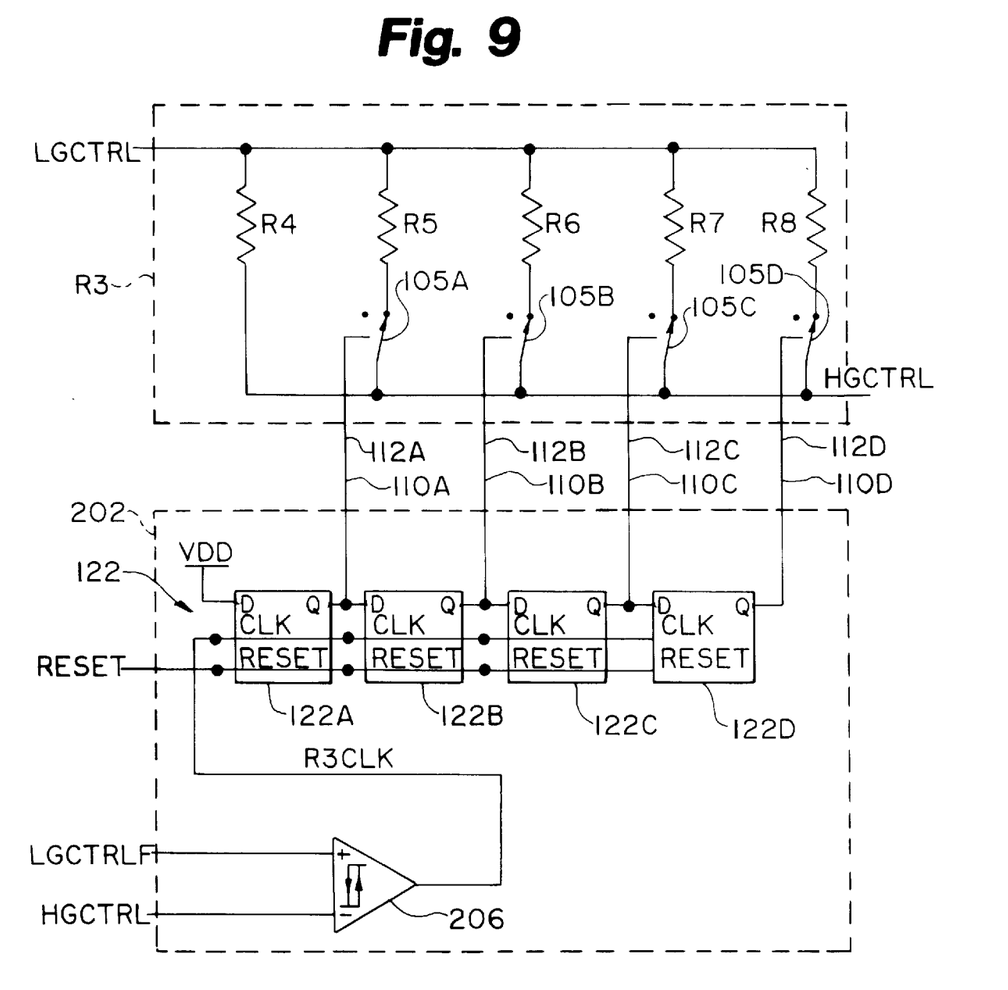
FIG. 9 is a schematic diagram of a control circuit for adjusting a filter resistance in a second control loop of the PLL shown in FIG. 8.

LOOP2 R3-CONTROL circuit 202 and filter resistor circuit R3 are shown in greater detail in FIG. 9. LOOP2 R3-CONTROL circuit 202 includes analog comparator 206 and shift register 122. Analog comparator 206 has a non-inverting input coupled to LGCTRLF, an inverting input coupled to HGCTRL and an output coupled to node R3CLK. Analog comparator 206 monitors the voltage difference between LGCTRLF and HGCTRL. Hysteresis in comparator 206 prevents false switching of R3CLK when the inputs of the comparator are near the threshold of the comparator.

Figure 10:
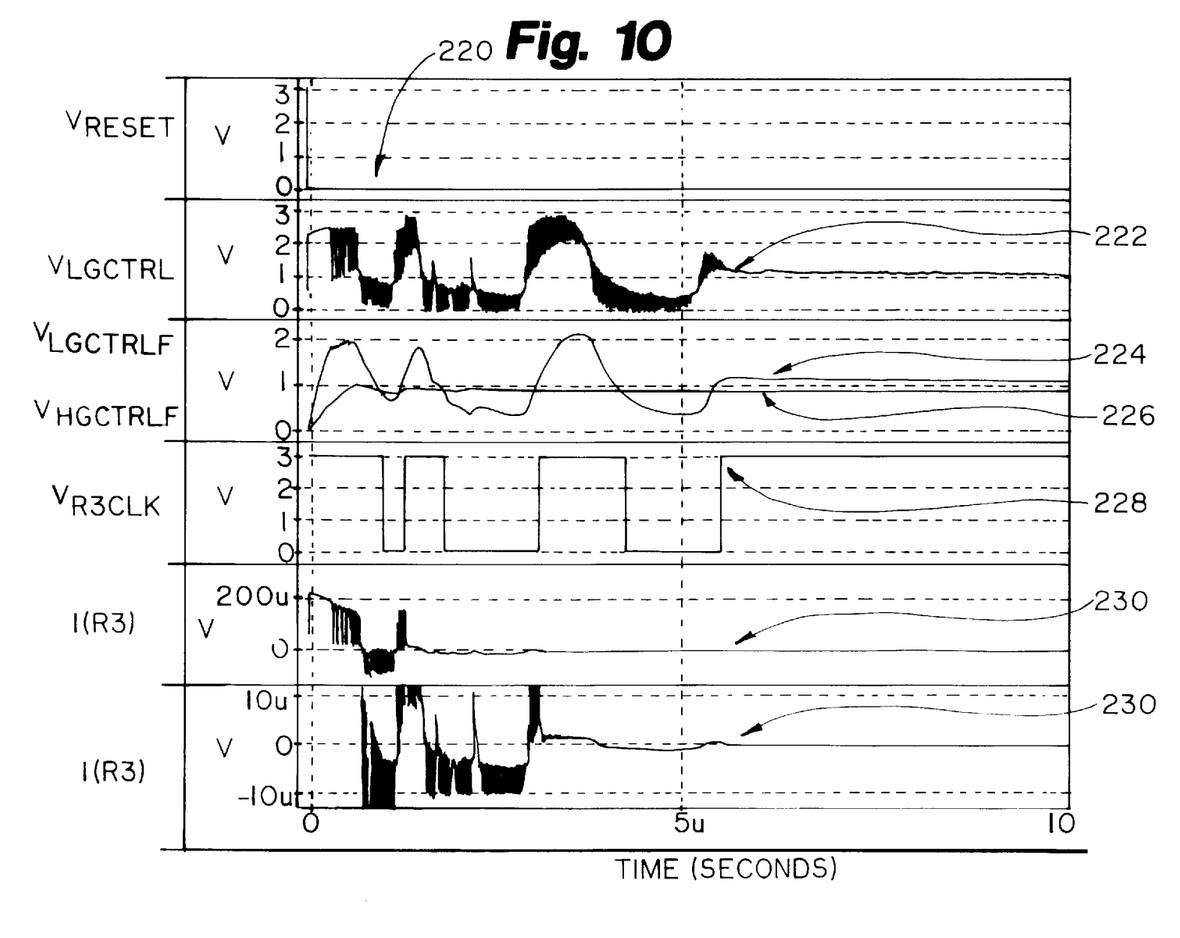
FIG. 10 is a waveform diagram illustrating the waveforms on various circuit nodes in the PLL shown in FIG. 8.

FIG. 10 is a waveform diagram illustrating the waveforms on various circuit nodes in PLL 200 from reset to lock. Waveform 220 represents the voltage on reset input 108. Waveform 222 represents the voltage on low gain control input LGCTRL. Waveform 224 represents the voltage on node LGCTRLF. Waveform 226 represents the voltage on high gain control input HGCTRL. Waveform 228 represents the voltage on R3CLK. Waveform 230 represents the current through filter resistor circuit R3, and is shown with two different scales on the y-axis.

At time t=0, $V_{RESET}$ goes low, and the voltages on LGCTRLF and HGCTRL begin to oscillate about their final values. When the voltage on LGCTRLF is higher than the voltage on HGCTRL, VCO 18 is running too slow and charge pump 16 is pumping charge onto filter node 44. Eventually, the voltage on LGCTRLF overshoots the voltage on HGCTRL, and VCO 18 is running too fast. Charge pump 16 then pumps charge off of filter node 44. Each time comparator 206 detects that the voltage on LGCTRLF crosses from below the voltage on HGCTRL to above the voltage on HGCTRL, shift register 122 shifts the logic high state from one flip-flop to the next, which increments the resistance of filter resistor circuit R3, as discussed above. When the voltage LGCTRLF stops oscillating about the voltage on HGCTRL, the voltage on R3CLK stops toggling and the resistance of filter resistor circuit R3 remains at its final value as the loop becomes stable.

The dual-loop PLL circuits shown in FIGS. 5 and 8 greatly reduce the lock time from that of the dual-loop PLL circuits shown in FIGS. 1 and 4, which have a fixed secondary loop time constant. In addition, the lock time is also reduced well below that of a traditional single-loop PLL. The loop bandwidth of the PLL is accurately set by the off-chip loop filter. The ultimate bandwidth of the on-chip, high-gain loop filter is irrelevant to the PLL performance as long as the bandwidth is sufficiently low.

Although the present invention has been described with reference to preferred embodiments, workers skilled in the art will recognize that changes may be made in form and detail without departing from the spirit and scope of the invention. For example, the entire circuit or portions of the circuit can be logically inverted. The present invention can be implemented with MOS technology or with various other technologies. Individual signals can be active high or active low, and corresponding circuitry can be inverted to suit a particular convention. The term "coupled" can include various types of connections or couplings and can include a direct connection or a connection through one or more intermediate components.

What is claimed is:

1. An integrated circuit comprising:
   a phase/frequency detector, a charge pump, and a voltage-controlled oscillator (VCO) which are coupled together in series to form a phase-locked loop, wherein the VCO has first and second VCO control inputs and has a VCO output coupled to the phase/frequency detector, and wherein the VCO has a lower voltage-to-frequency gain from the first VCO control input to the VCO output than from the second VCO control input to the VCO output;
   an off-chip loop filter input coupled between the charge pump and the first VCO control input; and
   an on-chip loop filter coupled between the first VCO control input and the second VCO control input.

2. The integrated circuit of claim 1 wherein the on-chip loop filter comprises a first-order RC filter.

3. The integrated circuit of claim 2 wherein the VCO further comprises a reference voltage input and wherein the first-order RC filter comprises a resistor coupled between the first VCO control input and the second VCO control input and a capacitor coupled between the second VCO control input and the reference voltage input.

4. The integrated circuit of claim 2 wherein the VCO further comprises a reference voltage input and wherein the first-order RC filter comprises a transimpedance amplifier coupled between the first VCO control input and the second VCO control input and a capacitor coupled between the second VCO control input and the reference voltage input.

5. The integrated circuit of claim 1 wherein:

the charge pump comprises first and second differential charge pump outputs;

the first VCO control input comprises first and second differential VCO control inputs which are coupled to the first and second differential charge pump outputs, respectively;

the second VCO control input comprises third and fourth differential VCO control inputs which are coupled to the first and second differential charge pump outputs, respectively, through the on-chip loop filter; and the off-chip loop filter input comprises a first integrated circuit pin coupled to the first differential charge pump output and a second integrated circuit pin coupled to the second differential charge pump output.

6. The integrated circuit of claim 1 and further comprising a divide by N frequency divider coupled between the VCO and the phase/frequency detector, where N is a positive integer.

7. A phase-locked loop comprising:

an integrated circuit comprising:

a phase/frequency detector, a charge pump, and a voltage-controlled oscillator (VCO) which are coupled together in series, wherein the VCO has first and second VCO control inputs coupled to the charge pump and has a VCO output, and wherein the VCO has a lower voltage-to-frequency gain from the first VCO control input to the VCO output than from the second VCO control input to the VCO output; and an on-chip loop filter coupled between the first VCO control input and the second VCO control input; and an off-chip loop filter coupled between the charge pump and the first VCO control input, wherein the off-chip loop filter is located off of the integrated circuit.

8. The phase-locked loop of claim 7 wherein the off-chip loop filter comprises a second-order loop filter and the on-chip loop filter comprises a first-order loop filter.

9. The phase-locked loop of claim 7 wherein:

the VCO further comprises a reference voltage input;

the integrated circuit further comprises a first external loop filter pin coupled to the charge pump and the first VCO control input and a second external loop filter pin coupled to the reference voltage input;

the off-chip loop filter comprises a first resistor and a first capacitor coupled in series between the first and second external loop filter pins and comprises a second capacitor coupled between the first and second external loop filter pins, in parallel with the first resistor and the first capacitor; and the on-chip loop filter comprises a third resistor coupled between the charge pump and the second VCO control input and a third capacitor coupled between the second VCO control input and the reference voltage input.

10. The phase-locked loop of claim 7 and further comprising a divide by N frequency divider coupled between the VCO and the phase/frequency detector, where N is a positive integer.

11. A method of generating a feedback signal in a phase-locked loop (PLL) on an integrated circuit, the method comprising:

comparing a phase and frequency of a reference signal to a phase and frequency of the feedback signal and generating a charge pump control signal as a function of the comparison;

pumping charge onto and off of a circuit node as a function of the charge pump control signal;

generating first and second frequency control voltages based on the charge pumped onto and off of the circuit node;

filtering the first frequency control voltage with an off-chip loop filter;

filtering the second frequency control voltage with an on-chip loop filter;

controlling the phase and frequency of the feedback signal as a function of the filtered first frequency control voltage; and controlling a center frequency of the feedback signal and as a function of the filtered second frequency control voltage.

12. The method of claim 11 wherein controlling the phase and frequency of the feedback signal comprises applying a first voltage-to-frequency gain from the first frequency control voltage to the feedback signal and applying a second voltage-to-frequency gain from the second frequency control voltage to the feedback signal, wherein the first voltage-to-frequency gain is less than the second voltage-to-frequency gain.

* * * * *